United States Patent
Chen

(10) Patent No.: US 9,859,601 B2
(45) Date of Patent: Jan. 2, 2018

(54) HARMONICS SUPPRESSION FILTER

(71) Applicant: HON HAI PRECISION INDUSTRY CO., LTD., New Taipei (TW)

(72) Inventor: Chen-Hsiang Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 231 days.

(21) Appl. No.: 14/681,786

(22) Filed: Apr. 8, 2015

(65) Prior Publication Data

US 2016/0072170 A1 Mar. 10, 2016

(30) Foreign Application Priority Data

Sep. 9, 2014 (TW) .............................. 103131013 A

(51) Int. Cl.
| H01P 1/212 | (2006.01) |
| H03H 7/09 | (2006.01) |
| H03H 7/01 | (2006.01) |
| H03H 7/42 | (2006.01) |
| H01P 1/203 | (2006.01) |
| H03H 1/00 | (2006.01) |

(52) U.S. Cl.
CPC .............. H01P 1/212 (2013.01); H01P 1/203 (2013.01); H01P 1/2039 (2013.01); H01P 1/20381 (2013.01); H03H 7/0115 (2013.01); H03H 7/09 (2013.01); H03H 7/427 (2013.01); H03H 2001/0085 (2013.01)

(58) Field of Classification Search
CPC ............ H03H 2001/0085; H03H 7/09; H03H 7/0115; H03H 7/427; H01P 1/212; H01P 1/2039; H01P 1/203

USPC ........ 333/177, 181, 185, 204, 176; 336/200, 336/215

See application file for complete search history.

(56) References Cited

U.S. PATENT DOCUMENTS

| 5,621,366 A * | 4/1997 | Gu ........................ H01P 7/084 333/185 |
| 5,977,847 A | 11/1999 | Takahashi |
| 6,927,664 B2 * | 8/2005 | Nakatani .................. H01P 5/10 336/200 |
| 2009/0267704 A1 | 10/2009 | Chang et al. |
| 2011/0043316 A1 * | 2/2011 | Yang ...................... H01F 19/04 336/192 |

FOREIGN PATENT DOCUMENTS

| CN | 100382384 | 4/2008 |
| CN | 101421763 A | 4/2009 |

(Continued)

Primary Examiner — Rakesh Patel
(74) Attorney, Agent, or Firm — Steven Reiss

(57) ABSTRACT

A harmonics suppression filter includes a main circuit, a first inner circuit, a first outer circuit, a first inner node and a first outer node. The first inner circuit, the first outer circuit and the main circuit are in the same layer of the base board. Meanwhile, the first inner circuit is located inside of the main circuit. There is an inner gap between the first inner circuit and the main circuit. The first outer circuit is located outside of the main circuit. There is an outer gap between the first outer circuit and the main circuit. The first inner node is located in the inner gap to couple the first inner circuit with the main circuit. The first outer node is located in the outer gap to couple the first outer circuit with the main circuit.

17 Claims, 13 Drawing Sheets

(56) References Cited

FOREIGN PATENT DOCUMENTS

| | | |
|---|---|---|
| CN | 101609915 A | 12/2009 |
| CN | 101997149 A | 3/2011 |
| CN | 201877548 U | 6/2011 |
| CN | 101615479 B | 12/2011 |
| CN | 102623777 A | 8/2012 |
| TW | 20061607 | 1/2006 |
| WO | 2008018658 | 2/2008 |

* cited by examiner

HARMONICS SUPPRESSION FILTER

FIELD

The subject matter herein generally relates to filters, more particularly to a harmonics suppression filter.

BACKGROUND

Microstrip components are applied for harmonic suppression in communication systems. Typical components used for harmonic suppression are large.

BRIEF DESCRIPTION OF THE DRAWINGS

Implementations of the present technology will now be described, by way of example only, with reference to the attached figures.

DETAILED DESCRIPTION

Figure 1:
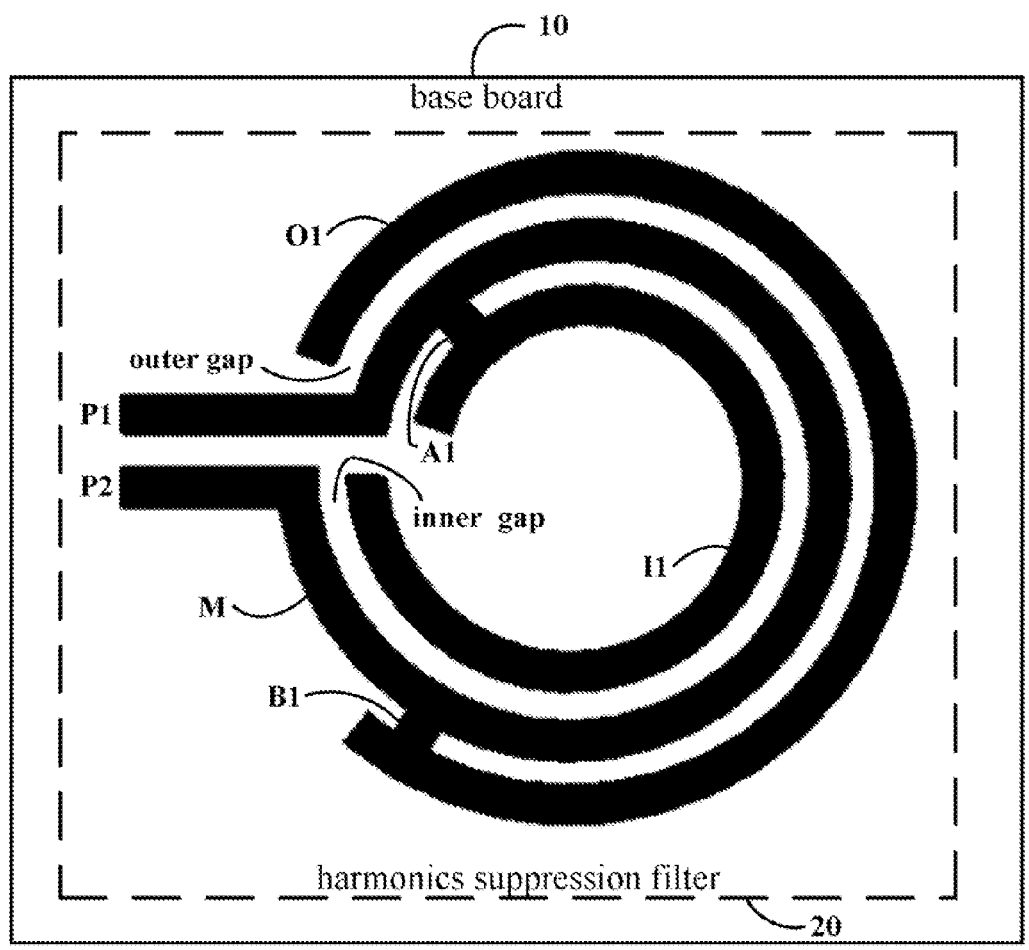
FIG. 1 illustrates a plane view of a first embodiment of a harmonics suppression filter.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "coupled" is defined as connected, whether directly or indirectly through intervening components, and is not necessarily limited to physical connections.

The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a harmonics suppression filter and a stack harmonics suppression filter.

FIG. 1 illustrates a plane view of a first embodiment of a harmonics suppression filter 20. The harmonics suppression filter 20 is located in a base board 10 and is configured to suppress harmonics. In at least one embodiment, the base board 10 is a printed circuit board (PCB). The harmonics suppression filter 20 includes a first signal port P1, a second signal port P2, a main circuit M, a first inner circuit I1, a first outer circuit O1, a first inner node A1 and a first outer node B1.

In order to reduce the space used by the harmonics suppression filter 20, the main circuit M and the first inner circuit I1 and the first outer circuit O1 are spiral-shaped. The first signal port P1 and the second signal port P2 are both strip-shaped. A first end of the main circuit M is coupled to the first signal port P1, a second end of the main circuit M is coupled to the second signal port P2.

The main circuit M, the first inner circuit I1 and the first outer circuit O1 are located in the first layer of the base board 10. And the first inner circuit I1 is located inside of the main circuit M. Moreover, there is an inner gap between the first inner circuit I1 and the main circuit M. The first outer circuit O1 is located outside of the main circuit M; there is an outer gap between the first outer circuit O1 and the main circuit M. The first inner node A1 is located in the inner gap and coupled with the main circuit M and the first inner circuit I1. The first outer node B1 is located in the outer gap and coupled with the main circuit M and the first outer circuit O1. Thus, the first signal port P1, the second signal port P2, the main circuit M, the first inner circuit I1, the first outer circuit O1, the first inner node A1 and the first outer node B1 are coupled together to enhance harmonics suppression.

Figure 2:
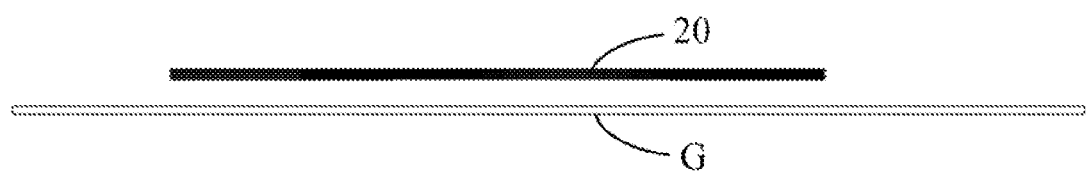
FIG. 2 illustrates a side view of the first embodiment of a harmonics suppression filter.

FIG. 2 illustrates a side view of the first embodiment of a harmonics suppression filter 20. In at least one embodiment, the harmonics suppression filter 20 is located in a layer of the base board 10, meanwhile a ground layer G is located in another layer of the base board 10.

Figure 3:
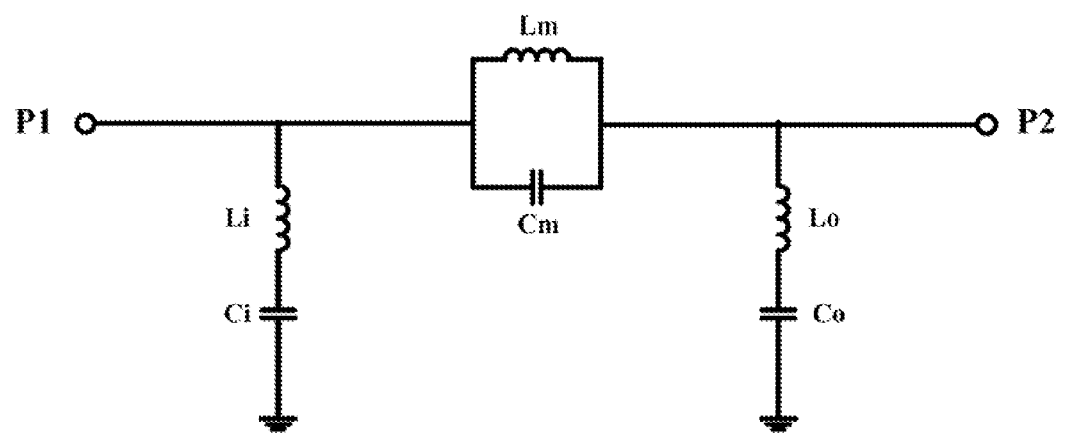
FIG. 3 illustrates an equivalent circuit of the first embodiment of a harmonics suppression filter.

FIG. 3 illustrates an equivalent circuit of the first embodiment of a harmonics suppression filter 20. The main circuit M is equivalent to a parallel circuit of an inductor Lm and a capacitor Cm. The first inner circuit I1 coupled to the main circuit M is equivalent to a series circuit of an inductor Li and a capacitor Ci coupled between the parallel circuit and the ground layer G. The first outer circuit O1 coupled to the main circuit M is equivalent to a series circuit of an inductor Lo and a capacitor Co coupled between the parallel circuit and the ground layer G.

Figure 4:
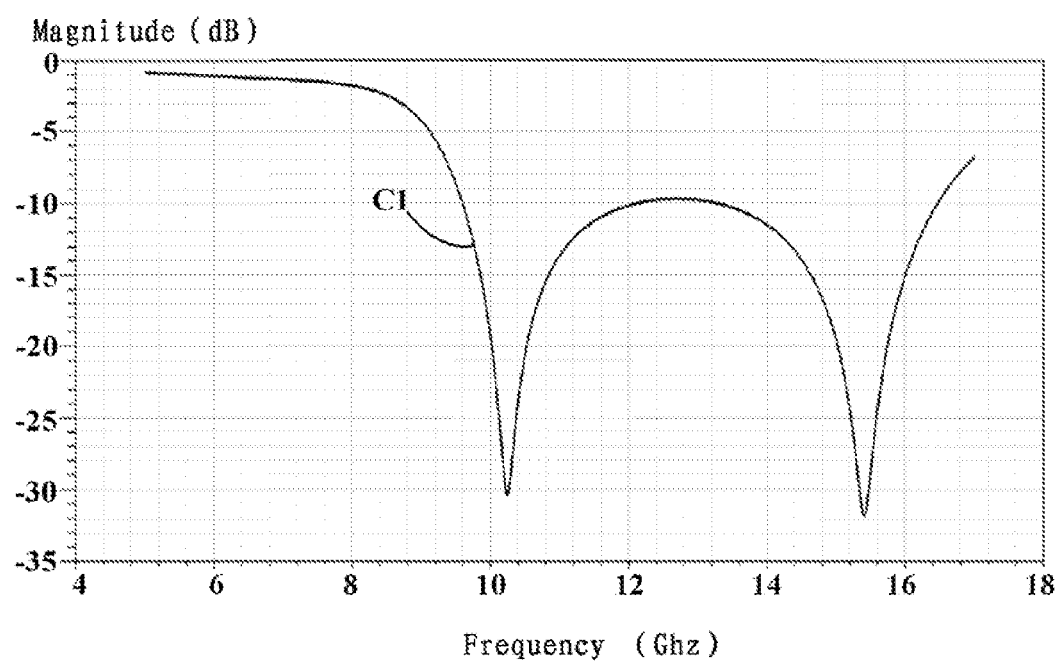
FIG. 4 illustrates a simulation diagram of the first embodiment of a harmonics suppression filter.

FIG. 4 illustrates a simulation diagram of the first embodiment of a harmonics suppression filter 20. A curve C1 shows harmonic suppressions among different frequencies.

Figure 5:
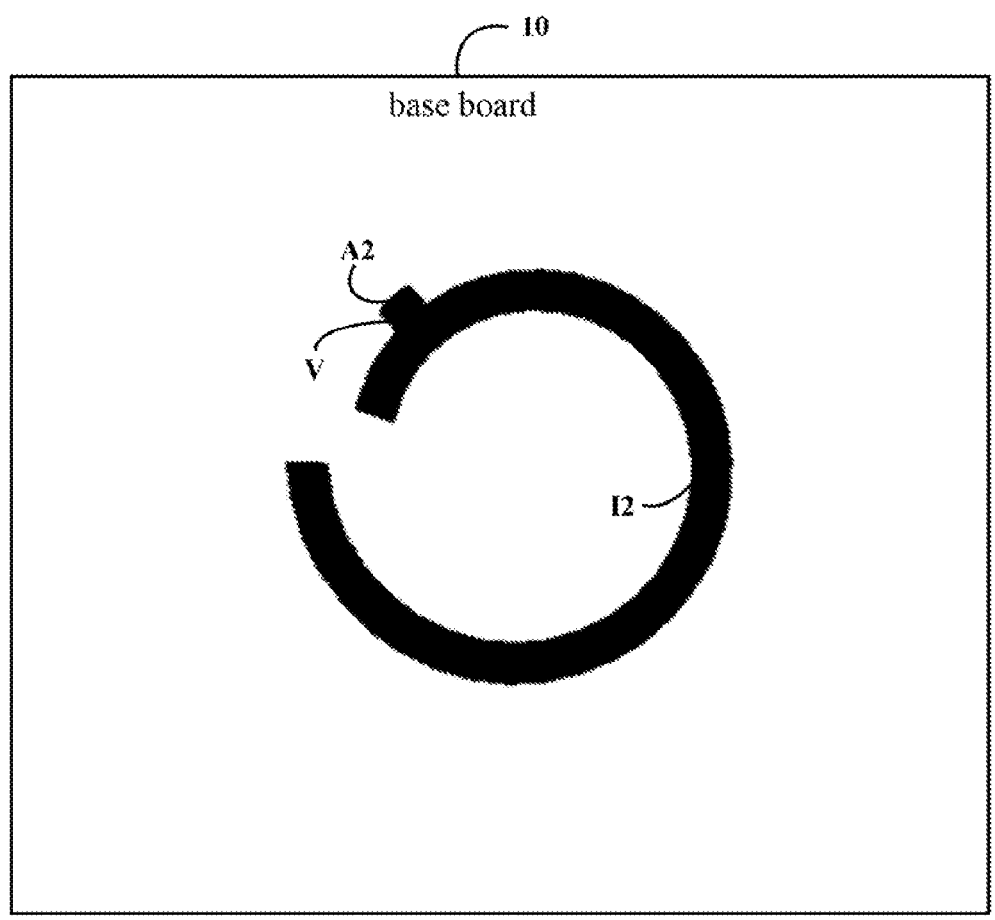
FIG. 5 illustrates a plane view of a second inner circuit and a second inner node of a second embodiment of a harmonics suppression filter.

FIG. 5 illustrates a plane view of a second inner circuit I2 and a second inner node A2 of a second embodiment of a harmonics suppression filter 20. The harmonics suppression filter 20 is located in a base board 10 of multilayer. The harmonics suppression filter 20 includes the structure of the first embodiment, and the harmonics suppression filter 20 further includes at least one second inner circuit I2 and at least one second inner node A2.

The structure of each second inner circuit I2 is similar to the first inner circuit I1. In the base board 10, each second inner circuit I2 and each second inner node A2 are located in the same layer different from the first layer in which the main circuit M is located. Each second inner circuit I2 and each second inner node A2 are located in the same layer and are correspondingly coupled together. Moreover, each second inner node A2 is located right above or right below the first inner node A1. Each second inner node A2 is coupled to the first inner node A1 through a via V. Thus, the first signal port P1, the second signal port P2, the main circuit M, the first inner circuit I1, the first outer circuit O1, the first inner node A1, the first outer node B1, the second inner circuit I2 and the second inner node A2 are coupled together to enhance harmonics suppression.

Figure 6:
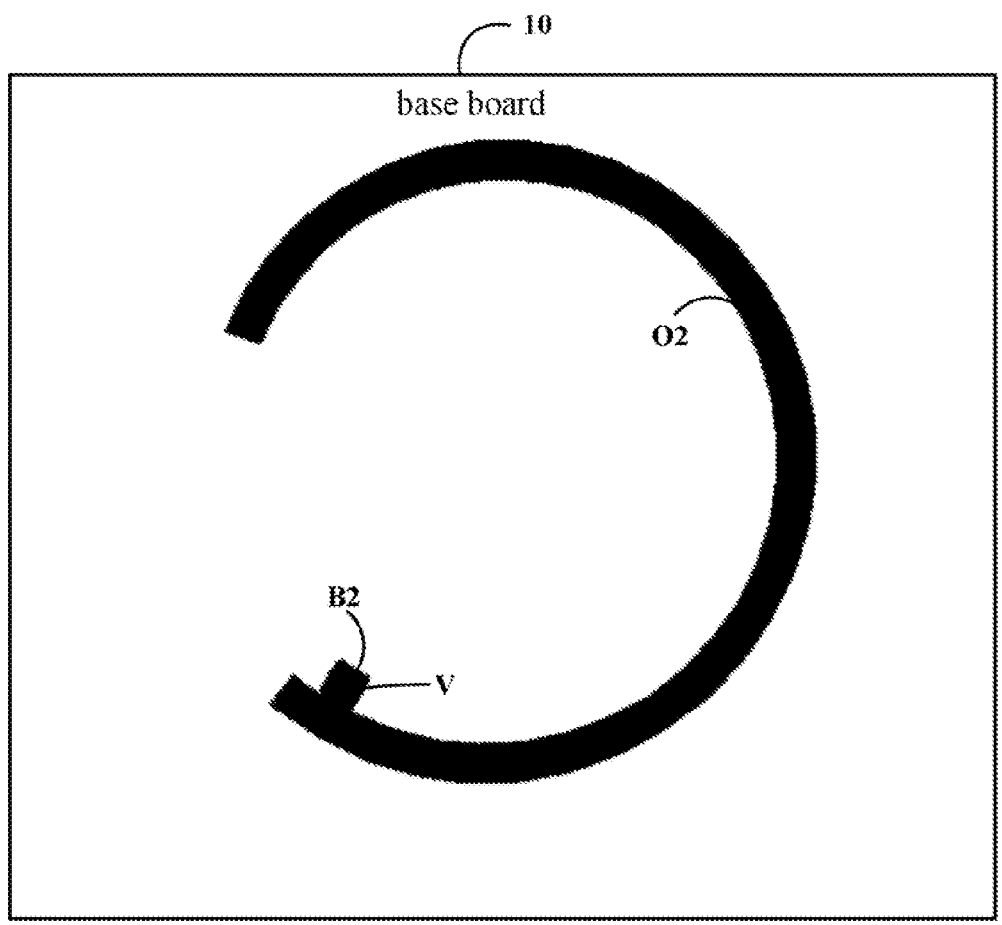
FIG. 6 illustrates a plane view of a second outer circuit and a second outer node of a third embodiment of a harmonics suppression filter.

FIG. 6 illustrates a plane view of a second outer circuit O2 and a second outer node B2 of a third embodiment of a harmonics suppression filter 20. The harmonics suppression filter 20 is located in a base board 10 of a multilayer PCB. The harmonics suppression filter 20 includes the said structure of the first embodiment; the harmonics suppression filter 20 further includes at least one second outer circuit O2 and at least one second outer node B2.

The structure of each second outer circuit O2 is similar to the first outer circuit O1. In the embodiment, each second outer circuit O2 and each second outer node B2 are located in the same layer of the multilayer PCB, different from the first layer in which the main circuit M is located. Each second outer circuit O2 and each second outer node B2 located in the same layer are coupled together. Moreover, each second outer node B2 is located right above or right below the first outer node B1 and is coupled to the first outer node B1 through a via V. Thus, the first signal port P1, the second signal port P2, the main circuit M, the first inner circuit I1, the first outer circuit O1, the first inner node A1, the first outer node B1, the second outer circuit O2, the second outer node B2 are coupled together to enhance harmonics suppression.

In at least one embodiment, the harmonics suppression filter 20 includes the structure of the first embodiment, and further includes at least one second inner circuit I2, at least one second inner node A2, at least one second outer circuit O2 and at least one second outer node B2. Each second inner node A2 is coupled to the first inner node A1 through a via V. Each second outer node B2 is coupled to the first outer node B1 through another via V.

Figure 7:
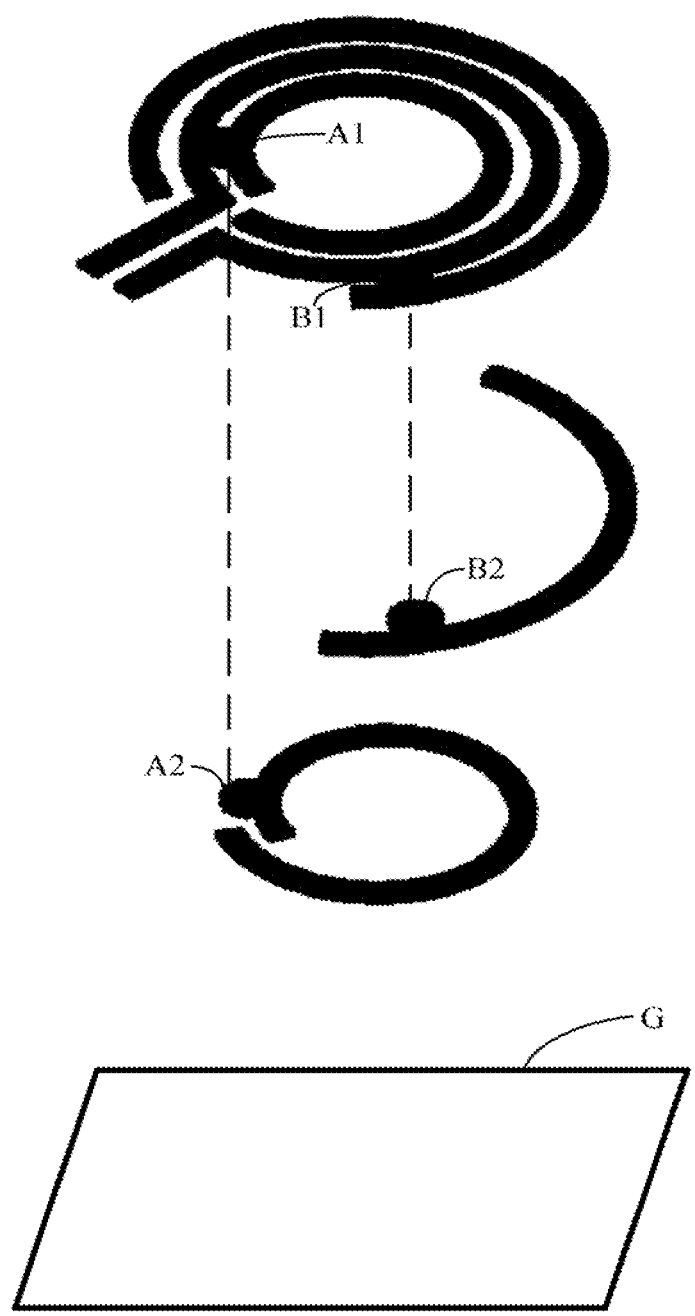
FIG. 7 illustrates an exploded view of a fourth embodiment of a harmonics suppression filter.
Figure 8:
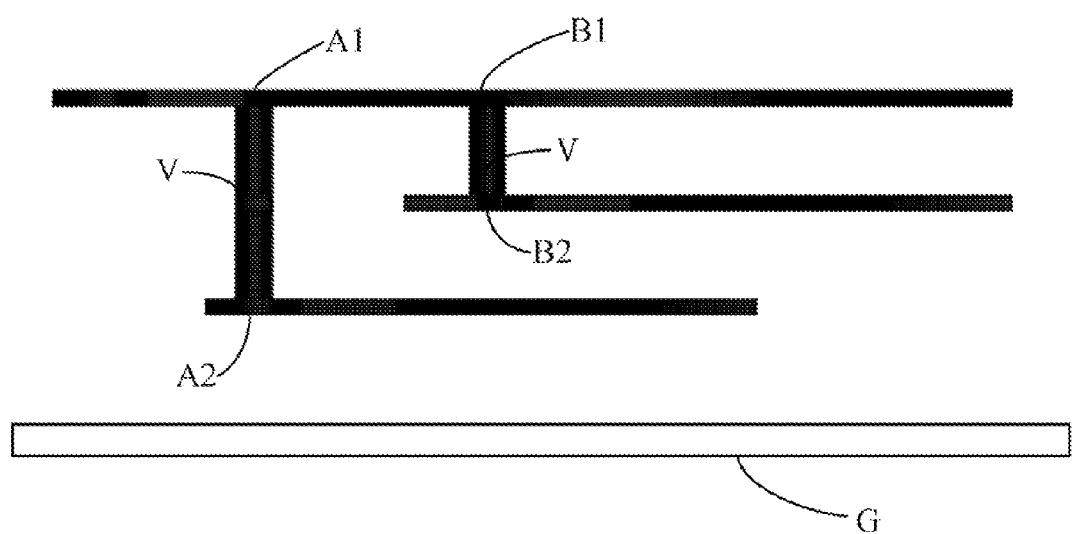
FIG. 8 illustrates a side view of the fourth embodiment of a harmonics suppression filter.

FIG. 7 illustrates an exposed view of a fourth embodiment of a harmonics suppression filter 20. FIG. 8 illustrates a side view of the fourth embodiment of a harmonics suppression filter 20. In the fourth embodiment, the harmonics suppression filter 20 includes a first signal port P1, a second signal port P2, a main circuit M, a first inner circuit I1, a first outer circuit O1, a first inner node A1 and a first outer node B1 as in the first embodiment, the harmonics suppression filter 20 further includes a second inner circuit I2, a second inner node A2, a second outer circuit O2 and a second outer node B2.

Figure 9:
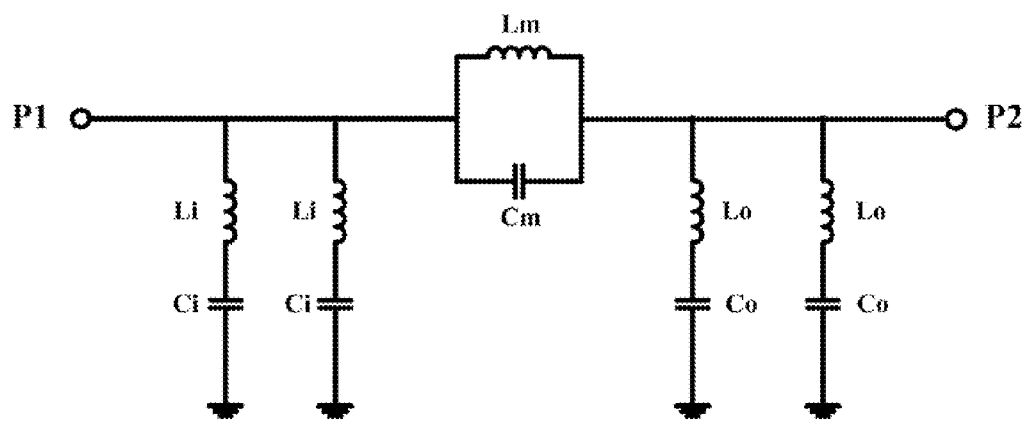
FIG. 9 illustrates an equivalent circuit of the fourth embodiment of a harmonics suppression filter.

FIG. 9 illustrates an equivalent circuit of the fourth embodiment of a harmonics suppression filter. The main circuit M is equivalent to a parallel circuit of an inductor Lm and a capacitor Cm. The first inner circuit I1 coupled to the main circuit M, and the second inner circuit I2 coupled to the main circuit M, are equivalent to a series circuit of an inductor Li and a capacitor Ci coupled between the parallel circuit and the ground layer G. The first outer circuit O1 coupled to the main circuit M, and the first outer circuit O2 coupled to the main circuit M, are equivalent to a series circuit of an inductor Lo and a capacitor Co coupled between the parallel circuit and the ground layer G.

Figure 10:
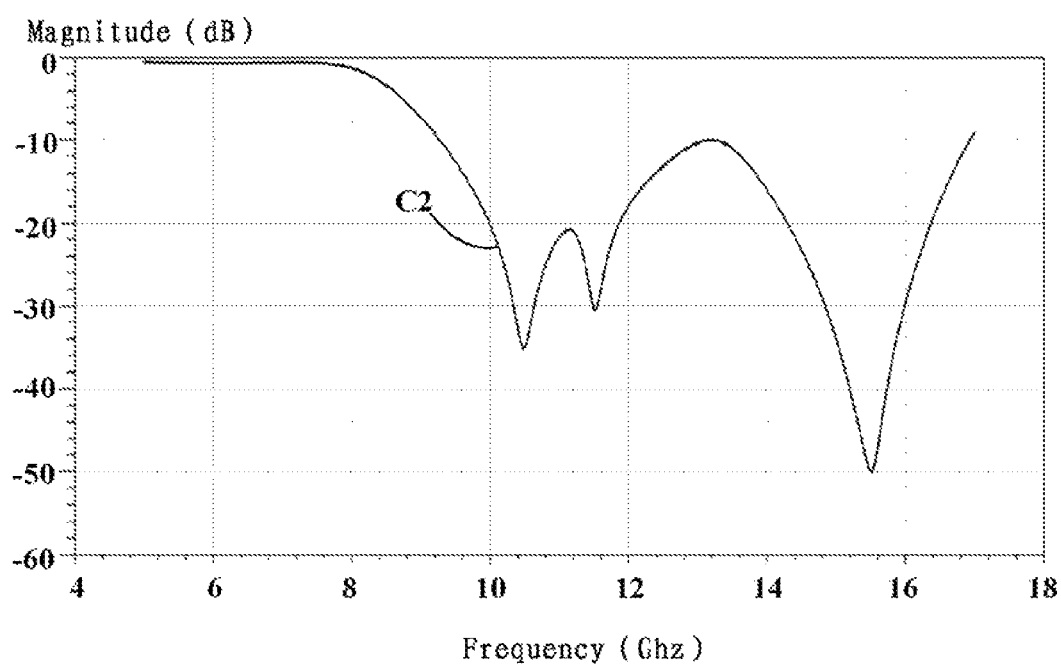
FIG. 10 illustrates a simulation diagram of the fourth embodiment of a harmonics suppression filter.

FIG. 10 illustrates a simulation diagram of the fourth embodiment of a harmonics suppression filter 20. A curve C2 shows harmonics suppression among different frequencies.

Figure 11:
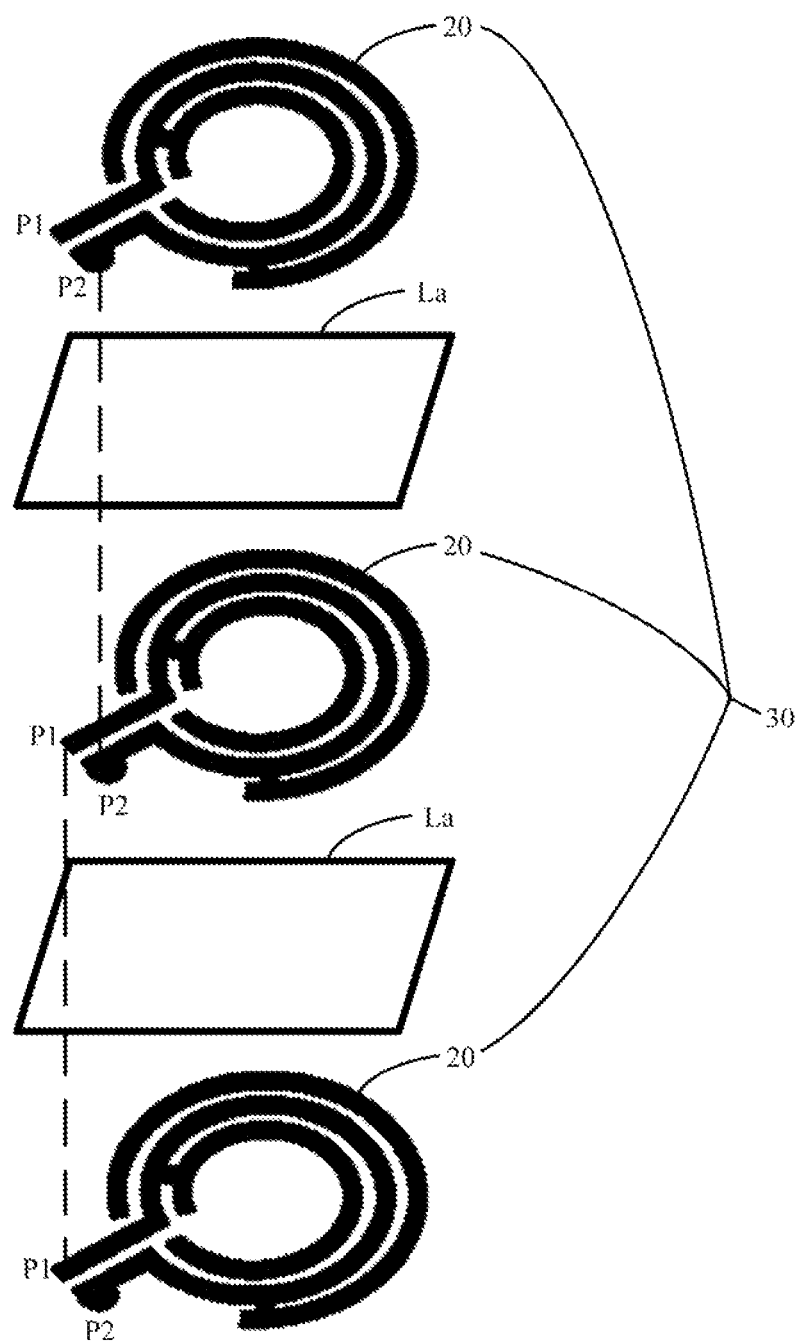
FIG. 11 illustrates an exploded view of a first embodiment of a stack harmonics suppression filter.
Figure 12:
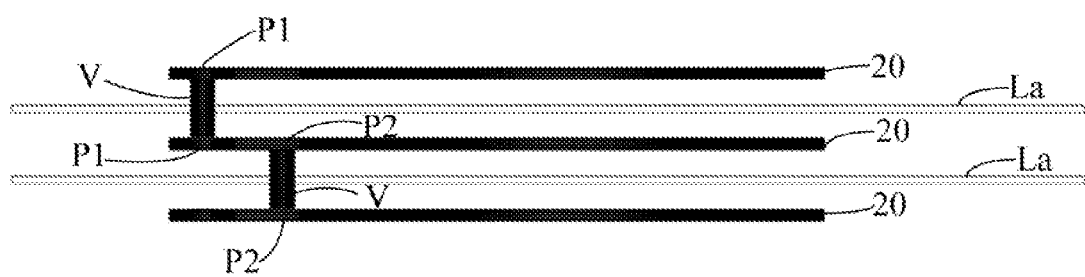
FIG. 12 illustrates a side view of the first embodiment of a stack harmonics suppression filter.

FIG. 11 illustrates an exposed view of a first embodiment of a stack harmonics suppression filter 30. FIG. 12 illustrates a side view of the first embodiment of a stack harmonics suppression filter 30. In order to enhance harmonics suppression, the stack harmonics suppression filter 30 includes at least two harmonics suppression filters 20. Each harmonics suppression filter 20 includes the structure of the first embodiment, and further includes at least one second inner circuit I2, at least one second inner node A2, at least one second outer circuit O2 and at least one second outer node B2. The first signal port P1 of each harmonics suppression filter 20 or the second signal port P2 of each harmonics suppression filter 20 is coupled together through a via V.

In the first embodiment of a stack harmonics suppression filter 30, the stack harmonics suppression filter 30 includes three harmonics suppression filters 20. The three harmonics suppression filter 20 are named as a first harmonics suppression filter 20, a second harmonics suppression filter 20 and a third harmonics suppression filter 20 respectively in the following description. The first harmonics suppression filter 20, the second harmonics suppression filter 20 and the third harmonics suppression filter 20 are respectively located in different layers of the base board 10. The first signal port P1 of the first harmonics suppression filter 20 is configured to input signals. The second signal port P2 of the first harmonics suppression filter 20 is coupled to the second signal port P2 of the second harmonics suppression filter 20 through a via V. The first signal port P1 of the second harmonics suppression filter 20 is coupled to the first signal port P1 of the third harmonics suppression filter 20 through another via V. The second signal port P2 of the third harmonics suppression filter 20 is considered an output. Thus, the three harmonics suppression filters 20 are coupled together in series. In at least one embodiment, additional layers La can be located among the harmonics suppression filters 20 to accommodate the other circuits, such as ground layers G.

Figure 13:
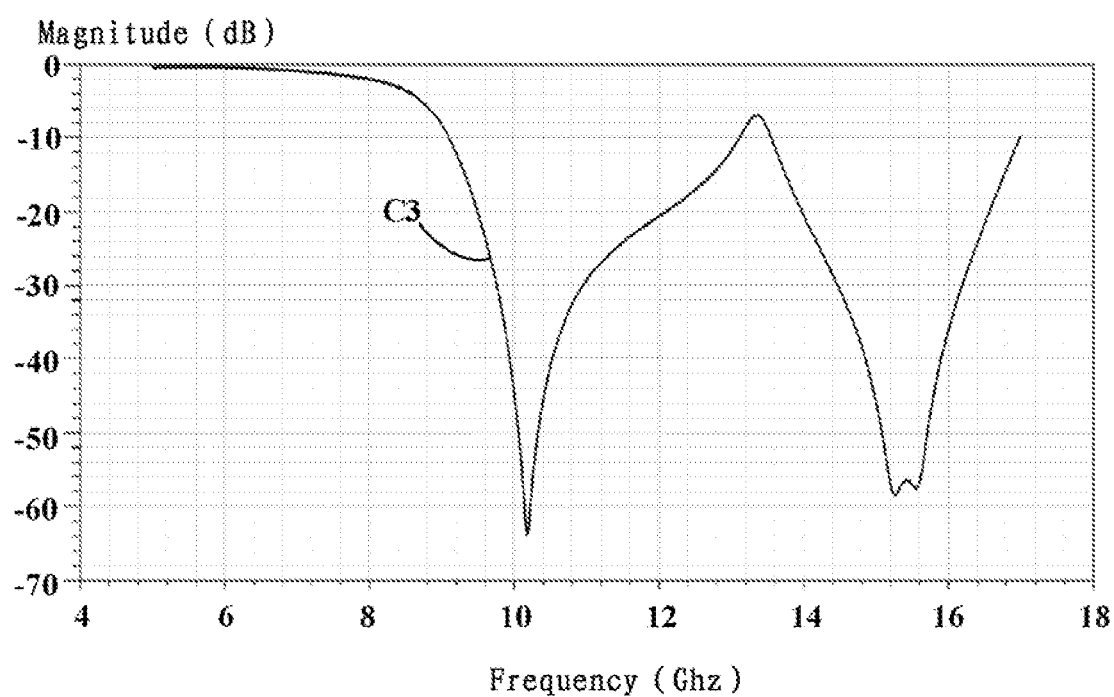
FIG. 13 illustrates a simulation diagram of one embodiment of a stack harmonics suppression filter.

FIG. 13 illustrates a simulation diagram of another embodiment of a stack harmonics suppression filter 30. A curve C3 shows harmonics suppressions among different frequencies. Referring to the curve C1, the curve C2 and the curve C3, different embodiments of the harmonics suppression filter 20 and the stack harmonics suppression filter 30 have better harmonics suppression effects.

Many details are often found in the art such as the other features of a harmonics suppression filter. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A harmonics suppression filter located in a base board for suppressing harmonics, the harmonics suppression filter comprising:
   a first signal port;
   a second signal port;
   a main circuit, located in a first layer of the base board, the main circuit comprising a first end coupled to the first signal port and a second end coupled to the second signal port;
   a first inner circuit, located in the first layer of the base board, and located inside of the main circuit, wherein the first inner circuit and the main circuit collectively define an inner gap;
   a first outer circuit, located in the first layer of the base board, and located outside of the main circuit, wherein the first outer circuit and the main circuit collectively define an outer gap;
   a first inner node, located in the inner gap and coupled with the main circuit and the first inner circuit;
   a first outer node, located in the outer gap and coupled with the main circuit and the first outer circuit; and
   wherein the first signal port, the main circuit, and the second signal port are coupled in series to form a loop; the first inner circuit is directly connected to the main circuit via only the first inner node to form a main circuit first branch; the first outer circuit is directly connected to the main circuit via only the first outer node to form a main circuit second branch.

2. The harmonics suppression filter as claimed in claim 1, further comprising:
   at least a second inner circuit, located in a second layer of the base board different from the first layer; and
   at least a second inner node, coupled to the second inner circuit in the second layer.

3. The harmonics suppression filter as claimed in claim 2, wherein the first inner node is coupled to the at least one second inner node through a via.

4. The harmonics suppression filter as claimed in claim 2, wherein the first inner circuit and the second inner circuit are both spiral-shaped.

5. The harmonics suppression filter as claimed in claim 1, further comprising:
   at least one second outer circuit, located in a second layer of the base board different from the first layer; and
   at least one second outer node, coupled to the second outer circuit in the second layer of the base board.

6. The harmonics suppression filter as claimed in claim 5, wherein the first outer node is coupled to the at least one second outer node through a via.

7. The harmonics suppression filter as claimed in claim 5, wherein the first outer circuit and the second outer circuit are both spiral-shaped.

8. The harmonics suppression filter as claimed in claim 1, wherein the main circuit is spiral-shaped, the first signal port and the second signal port are both strip-shaped.

9. A stack harmonics suppression filter located in a base board for suppressing harmonics, comprising:
   at least two harmonics suppression filters each comprising:
      a first signal port;
      a second signal port;
      a main circuit, located in a first layer of the base board with a first end coupled to the first signal port, and a second end coupled to the second signal port;
      a first inner circuit, located in the first layer of the base board with the main circuit, and located inside of the main circuit, wherein the first inner circuit and the main circuit collectively define an inner gap;
      a first outer circuit, located in the first layer of the base board with the main circuit, and located outside of the main circuit, wherein the first outer circuit and the main circuit collectively define an outer gap;
      a first inner node, located in the inner gap and coupled with the main circuit and the first inner circuit; and
      a first outer node, located in the outer gap and coupled with the main circuit and the first outer circuit;
      wherein the at least two harmonics suppression filters are located in different layers of the base board and are coupled together via the first signal port or the second signal port.

10. The stack harmonics suppression filter as claimed in claim 9, wherein each of the at least two harmonics suppression filters further comprises:
    at least one second inner circuit, located in different layers of the base board with the main circuit; and
    at least one second inner node, coupled to the second inner circuit in the same layer of the second inner node.

11. The stack harmonics suppression filter as claimed in claim 10, wherein the first inner node is coupled to the at least one second inner node through a via.

12. The stack harmonics suppression filter as claimed in claim 10, wherein the first inner circuit and the second inner circuit are spiral-shaped.

13. The stack harmonics suppression filter as claimed in claim 9, wherein each of the at least two harmonics suppression filters further comprises:
    at least one second outer circuit, located in a second layer of the base board with the main circuit; and
    at least one second outer node, coupled to the second outer circuit in the same layer of the second outer node.

14. The stack harmonics suppression filter as claimed in claim 13, wherein the first outer node is coupled to the at least one second outer node through a via.

15. The stack harmonics suppression filter as claimed in claim 13, wherein the first outer circuit and the second outer circuit are both spiral-shaped.

16. The stack harmonics suppression filter as claimed in claim 9, wherein the main circuit is spiral-shaped, the first signal port and the second signal port are both strip-shaped.

17. The stack harmonics suppression filter as claimed in claim 9, wherein parts of the first signal ports of the at least two harmonics suppression filters are coupled together through vias, or parts of the second signal ports of the at least two harmonics suppression filters are coupled together through vias.

* * * * *